United States Patent [19]

Porzio et al.

[11] Patent Number: 4,845,450

[45] Date of Patent: Jul. 4, 1989

[54] SELF-BIASED MODULAR MAGNETOSTRICTIVE DRIVER AND TRANSDUCER

[75] Inventors: Raymond Porzio, Narragansett; William J. Harrold, Kingston; James R. Sturges, Barrington, all of R.I.

[73] Assignee: Raytheon Company, Lexington, Mass.

[21] Appl. No.: 869,622

[22] Filed: Jun. 2, 1986

[51] Int. Cl.⁴ ............................................. H01H 55/00
[52] U.S. Cl. ...................................... 335/215; 310/26
[58] Field of Search .......................... 335/215; 310/26

[56] References Cited

U.S. PATENT DOCUMENTS

| | | | |
|---|---|---|---|
| 2,930,911 | 3/1960 | Halliday et al. | 310/26 |
| 3,484,630 | 12/1969 | Schwartz | 310/26 |
| 4,104,549 | 8/1978 | Akimoto et al. | 310/26 |
| 4,151,432 | 4/1979 | Akimoto et al. | 335/215 X |

*Primary Examiner*—Thomas H. Tarcza
*Assistant Examiner*—John B. Sotomayor
*Attorney, Agent, or Firm*—Martin M. Santa; Richard M. Sharkansky

[57] ABSTRACT

The drive modules of a magnetostrictive transducer are fabricated from interleaved permanent magnet disks (samarium cobalt) and high-strain, low-permeability magnetostrictive lanthanide alloy (Terfenol-D) disks to form a stack of such interleaved materials of substantially uniform magnetic field distribution in the stack. Two such stacks in side-by-side relationship provide a series-aiding magnetic circuit completed through high-permeability flux return pole pieces at their ends thereby providing a substantially uniform magnetic field distribution in the stack. Each stack has longitudinally-extending and electrically-insulated planar cuts and each flux return pole piece is a laminate of thin sheets of high-permeability electrically-insulated steel to reduce eddy current losses resulting from the AC field. The steel sheets are constrained by a nonmagnetic end-block into which the steel sheets are inserted and bonded.

20 Claims, 6 Drawing Sheets

SELF-BIASED MODULAR MAGNETOSTRICTIVE DRIVER AND TRANSDUCER

BACKGROUND OF THE INVENTION

This invention relates to transducers for the transmission of sonic energy and more particularly to a self-biased transducer having drive stacks comprised of interleaved high remanent flux magnets and high-strain magnetostrictive material for producing sonic energy of high power and with high performance.

Magnetostrictive lanthanide alloys, such as Terfenol-D (i.e. $Tb_{0.3}Dy_{0.7}Fe_{1.9}$), are capable of producing over five times the rms strain developed by the most competitive piezoceramics and ten times the rms strain developed by the most competitive non-lanthanide (i.e. nickel) magnetostrictive alloys. Since the acoustic output power generated by an underwater transducer is proportional to the square of the strain, this can result in a large advantage in power producing capability. Additionally, lanthanides such as Terfenol-D have lower sound speeds than non-lanthanide magnetostrictive alloys and piezoceramics and posess seventeen times the thermal conductivity of piezoceramics such as lead-ziconate-titanate. The low sound speed tends to improve bandwidth and lowers resonance frequency, while the high thermal conductivity tends to improve power handling ability and increases attainable duty cycle. The degree to which these advantages can be adequately exploited depends upon overcoming several problems which arise in transducer design because of certain intrinsic properties of the lanthanide material.

Terfenol-D has a relative permeability of only four or five, at least an order of magnitude lower than magnetostrictive nickel alloys. In addition, for purposes of economy of length and cost effectiveness, relatively short lengths of the material are used. The combination of low permeability and low length-to-diameter ratio of the Terfenol-D rods resulted in non-uniform bias and drive fields in prior-art transducer designs which led to utilization of only a portion of the material and non-uniform strain in the material. Demagnetization effects and fringing flux tend to increase leakage inductance and degrade transducer coupling. The low length-to-diameter ratio also leads to stray flux finding its way into metallic transducer components where eddy currents and hysteresis losses lower conversion efficiency.

Unlike piezoceramics, which are prepoled, Terfenol-D and the other lanthanide alloys require a polarizing field because they are magnetically soft and retain insufficient remanent fields for linear operation. In the case of Terfenol-D, the polarizing field may be supplied by either a coil carrying direct current or permanent magnets.

If DC current is used to supply the bias field, it may be superimposed on the AC drive coil or may be carried on a separate coil. If separate AC and DC power supplies are employed and the currents are superimposed in one coil, a large choke is required to pass DC and avoid driving the DC supply with the AC power source. Also, a large condenser is required to pass AC and block DC current from entering the AC supply. If separate windings carry AC and DC, the requirement for the condenser is removed, but a large burdensome choke in series with the DC current winding is still required since the two coils will be coupled due to the transformer action of two concentric coils magnetically linked by a common core.

The requirement for separate DC and AC power supplies can be avoided by various solid state amplifier approaches, but these approaches similarly suffer from the requirement for bulky magnetics such as heavy autotransformers. Additionally, all DC-current biasing approaches result in a heavy thermal burden being placed on the transducer, eroding much of the potential advantage gained by the drive material's high thermal conductivity. Overall efficiency is also decreased not only by DC power being dissipated in the transducer, but also because of DC transmission losses occurring in the DC power supply cable, especially when the cable runs are long.

The alternative to direct current biasing is biasing with permanent magnets. In the prior art, the cost of permanent magnet biasing is usually decreased AC efficiency, decreased transducer coupling, and overall reduced transducer performance. The AC efficiency is normally reduced because the permanent magnets also have very low permeabilities and therefore increase the reluctance of the magnetic circuit. Hence, greater magnetomotive force (greater AC drive current) is required to achieve a given flux density, resulting in increased coil losses. Since eddy currents in the magnets cause additional losses, the permanent magnet material may have to be shielded with sheet metal to avoid demagnetizing the permanent magnets with the AC drive field. As a result of eddy currents, large amounts of energy ar dissipated in the magnet shielding, which usually results in a catastrophic decrease in efficiency. The low reluctance of the AC magnetic circuit results in greater fringing, which leads to additional losses due to stray flux entering metal transducer parts. Also, large amounts of energy are stored in permanent magnets, thereby increasing leakage inductance, raising the electrical quality factor, and reducing transducer coupling. If the permanent magnets are not placed in an optimum way, the magnetostrictive drive material is likely to be biased non-uniformly, resulting in poor utilization of the drive material with some regions insufficiently biased and others near saturation. Hence, the use of permanent magnets as in the prior art does not in itself guarantee high efficiency or improvement in overall performance.

SUMMARY OF THE INVENTION

The foregoing problems of the prior art are overcome and other objects and advantages of permanent magnet biasing of lanthanide magnetostrictive materials are provided by a magnetostrictive transducer and its drive modules fabricated from interleaved permanent magnet disks and high strain magnetostrictive material disks to form a stack of such interleaved materials. Two such stacks in side-by-side relationship have their series-aiding magnetic circuit completed through high permeability flux return pole pieces. Each stack is surrounded by an electrical solenoid which provides a substantially uniform alternating field within its respective stack. Each stack has longitudinally extending planar cuts which are substantially parallel to the AC field in each stack produced by the solenoid. These planar cuts reduce eddy current loss within the stacked materials. The flux return pole pieces are laminates of thin sheets of high permeability steel which are electrically insulated from one another to likewise reduce eddy current loss resulting from the AC field. The steel sheets are constrained by a non-magnetic end-block into which the steel sheets are inserted and bonded. The mating surfaces of the pole pieces and the stacks are ground flat and smooth so that minimum air gaps exist at their juncture. Excitation of the solenoids is phased to cause each stack to expand and contract in unison to produce relative motion of the end pieces. The outermost surfaces of the end blocks are in contact with the piston masses of the transducer of which the module is a driving element. The piston masses and the end blocks are ground flat so that good contact is made between them. The magnetic disks are made of a magnetic material which provides high magnetic flux and whose remanent flux is resistant to the magnetomotive force of the applied AC magnetic field. Samarium cobalt has been found suitable for this application. The magnetostrictive disks are typically made of a lanthanide material, Terfenol-D being preferred, which has high strain per unit AC magnetomotive force.

BRIEF DESCRIPTION OF THE DRAWINGS

The aforementioned aspects and other features of the present invention will be apparent from the following description taken in conjunction with the accompanying drawings wherein.

DESCRIPTION OF THE PREFERRED EMBODIMENT

Figure 1:
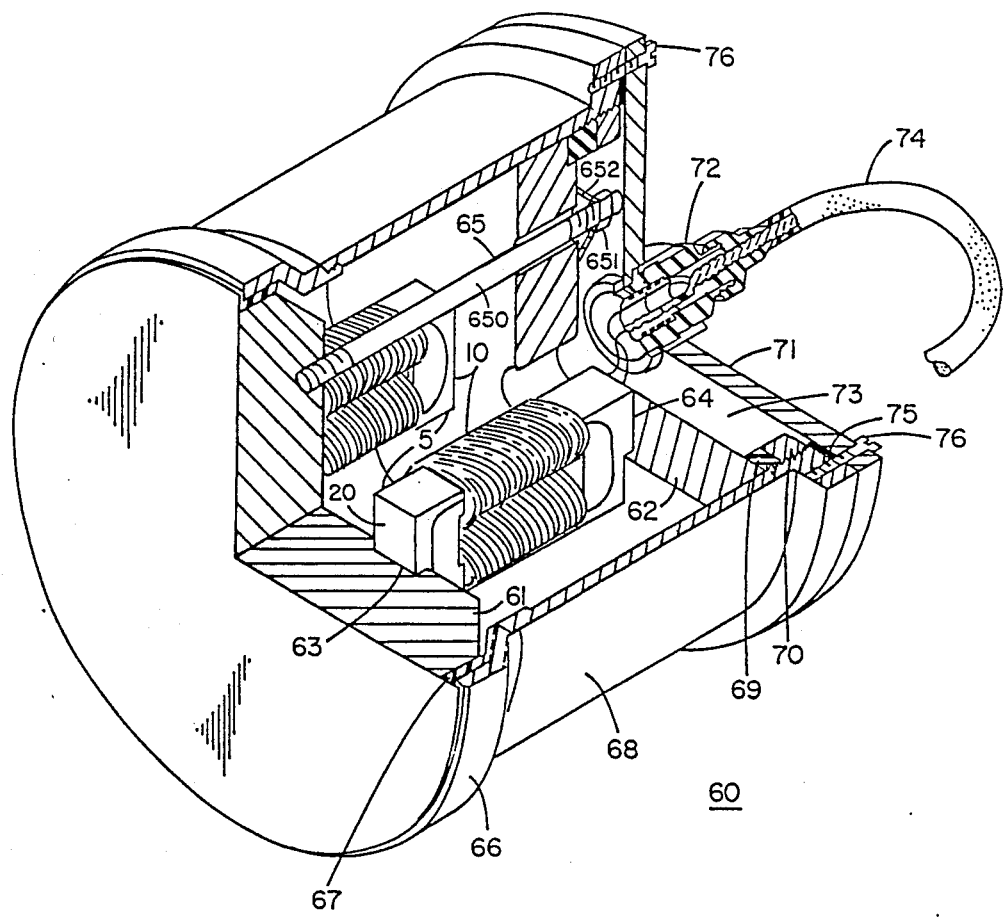
FIG. 1 is an isometric view in partial section of a transducer incorporating the drive modules of this invention.

FIG. 1 shows an isometric view in partial cross-section of a tonpilz transducer 60 constructed using the drive modules 10 of this invention. The transducer 60 comprises a headmass 61 (typically aluminum) and a tailmass 62 (typically stainless steel) each of which have recesses 63, 64, respectively into which the end blocks 5 of the module 10 are recessed. Only two modules 10 are shown in FIG. 1. However, it should be understood that as many modules as can be accomodated in the space within transducer 60 may be used. A tie rod/belleville spring assembly 65 applies a compressive force between the headmass 61 and tailmass 62 to place the module 10 under the desired compressive force. A shroud 66, connected to the headmass 61 by a vulcanized rubber seal 67, is attached to shell 68. The tailmass 62 is also in contact with shell 68 through a pressure release material 69 which is in compression from threaded ring 70 which is threaded into the shell 68. A back plate 71 containing a connector assembly 72 is connected to the housing 68 to form a waterproof seal therewith. The cavity 73 formed by the back plate 71 and the tailmass 62 provides space for an electrical tuning network (not shown) and the electrical connection of the modules 10 to the wires of cable 74 through the connector 72. The wires in cable 74 comprise the alternating current power wires for energizing the modules 10 from a transmitter (not shown) and which may also be used for carrying signals detected by the modules 10 to a receiver (not shown). The back plate 71 forms a watertight seal with the housing 68 because of the sealing material 75 which is in compression between the periphery of back plate 71 and the housing 68 provided by the tensioning of screws 76. The interior of the transducer 60 is thus a watertight enclosure in which the modules 10 can be electrically actuated to produce movement of the headmass 61 relative to the tailmass 62. In a transducer such as that typified by the transducer 60, FIG. 1, the drive module 10 is acoustically coupled to the mechanical load provided by the headmass 61 and tail mass 62 by means of greased coupling joints provided by the recess 63 into which the shell end block 5 is closely fitted. The mating surface of the shell end block 5 and the bottom of the groove 63 are made smooth and flat so that there is good mechanical contact between these mating parts. These coupling joints are kept in compression by the mechanical pre-stress system comprising the tie rod assembly 65 in which rod 650 is threaded into the headmass 61 and which is tensioned by the nut 651 compressing belleville spring 652 against the tailmass 62. The easily machined shell block 5/pole piece 4 assembly 7 of module 10 facilitates this type of mechanical coupling. The modular design makes the drive assembly comprising modules 10 easily replaceable in the event of failure of any module.

Figure 2:
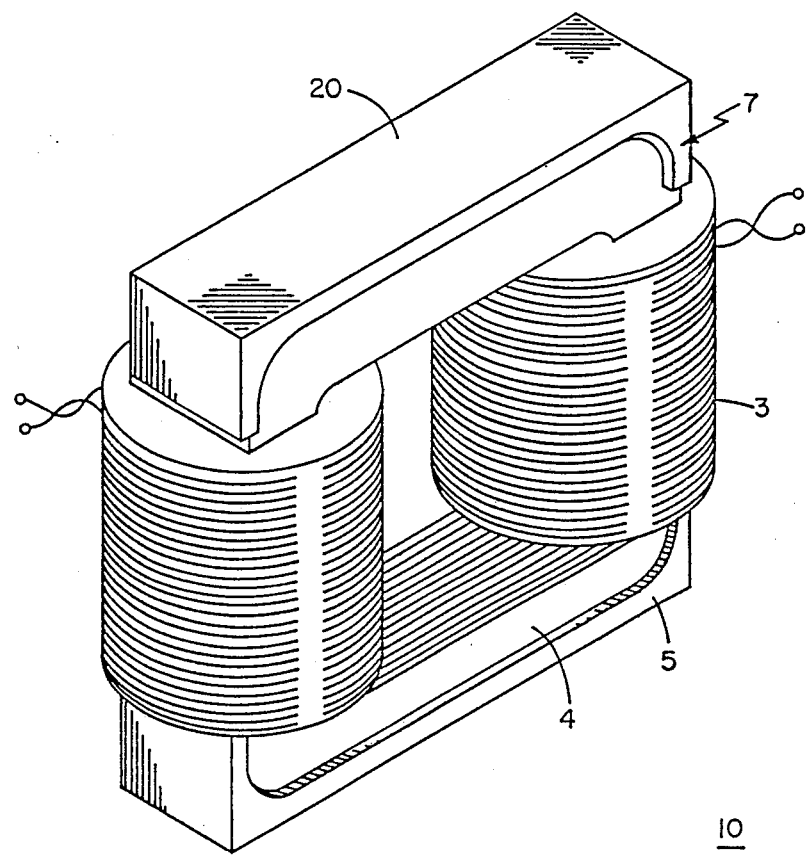
FIG. 2 is an isometric view of a drive module of this invention.
Figures 3, 4:
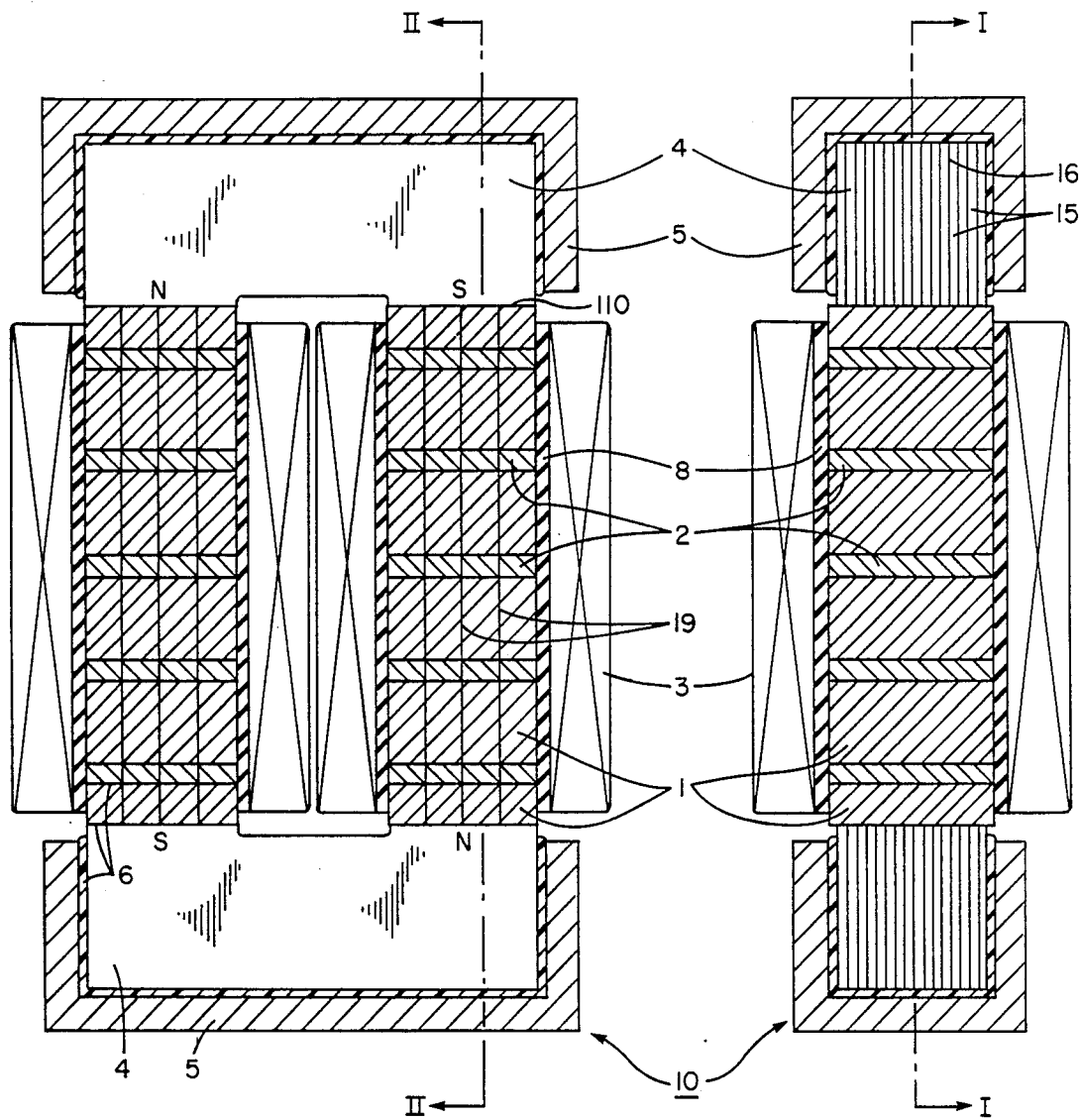
FIGS. 3 and 4 are cross-sectional views of the drive module of FIG. 2.

Referring now to FIGS. 2–5, there are shown an isometric view, two cross-sectional views, and an exploded view, respectively, of one embodiment of a magnetostrictive drive module 10 constructed in accordance with this invention. FIGS. 3 and 4 are sectional views taken along section lines I—I and II—II of FIGS. 4 and 3, respectively. Two magnetostrictive stacks 11 are provided for the module 10. Each stack 11 comprises interleaved laminated disks of magnetostrictive material 1 and laminated disks of permanent magnets 2. Each stack 11 is substantially enclosed except for its ends by a coil 3 which is connected to a source of alternating current (not shown) for providing alternating magnetomotive force to each stack 11. The permanent magnets 2 in each stack 11 have the same direction of magnetization and are arranged so that the stacks 11 are poled in opposite N,S directions as shown in FIG. 3. The magnetic path is completed by causing the ends 110 of stacks 11 to be in contact with pole pieces 4 thereby completing the magnetic circuit comprising stacks 11 and pole pieces 4. The pole pieces 4 comprise a stack of 2 mil laminations of SiFe steel sheets. These pole pieces 4 are contained within a shell end block 5, typically of aluminum or stainless steel, and secured within said end block 5 by structural epoxy 6, such as commercially available type A-2/E. The drive coils 3 are wound with high temperature magnet wire, typically number 18 AWG insulated magnet wire. The space between a stack 11 and the coil 3 is filled with silicone rubber 8. In one embodiment, the stack 11 is wrapped with silicone tape (such as commercially available Moxness tape) prior to the preceding step and assembly into the module 10. The silicone rubber serves to decouple the coil 3 from the stack 11, which vibrates when the coil 3 is driven with alternating current. The silicone rubber 8 also serves to insulate the stack from the coil, to support the coil, and to improve thermal conduction from the coil to the stack.

In a preferred embodiment of the invention, the stacks 11 of interleaved magnetostrictive material 1 and permanent magnet material 2 comprises stacks of laminated disks of Terfenol-D (or other lanthanide drive material) interleaved with laminated disks of samarium cobalt permanent magnets 2. The samarium cobalt magnets have the property of having high energy product with high intrinsic coercivity such that the magnet is not demagnetized, but maintains a stable direct magnetic field in the magnet c circuit comprising stacks 11 and pole pieces 4 in spite of large AC drive fields and high temperatures within the stack 11 produced by the coils 3. The magnetic circuit is completed by the pair of return paths provided by the pole pieces 4 which consist of low loss, high permeability, laminated silicon iron, $\mu_r$ approximately equal to $10^4$, or similar ferromagnetic material. The laminations 15 are electrically insulated from one another by insulating varnish 16 as in conventional transformer design technology and the laminations are very thin (1 or 2 mils thickness). The laminations 15 are oriented such that they are in the same direction as the magnetic flux of the magnetostrictive stacks. This orientation, in addition to providing a low reluctance path with low eddy current losses, results in a pole piece 4 which is mechanically very rigid in the direction of longitudinal vibration produced by the Terfenol-D material 1 and serves to enhance thermal conduction from the magnetostrictive stacks 11 to the end blocks 5. Heat is conducted from the end blocks 5 to head mass 61 and tail 62 mass components of a transducer 60 (shown in FIG. 1). The head mass, when in operation, is in thermal contact with sea water. The aluminum (or nonmagnetic stainless steel) hollow end blocks 5 serve as shells into which the silicone iron laminations 15 are cemented into place with structural epoxy 6. The resulting pole piece/end block assembly 7 has nearly the same structural rigidity as a solid block of metal.

Figure 5:
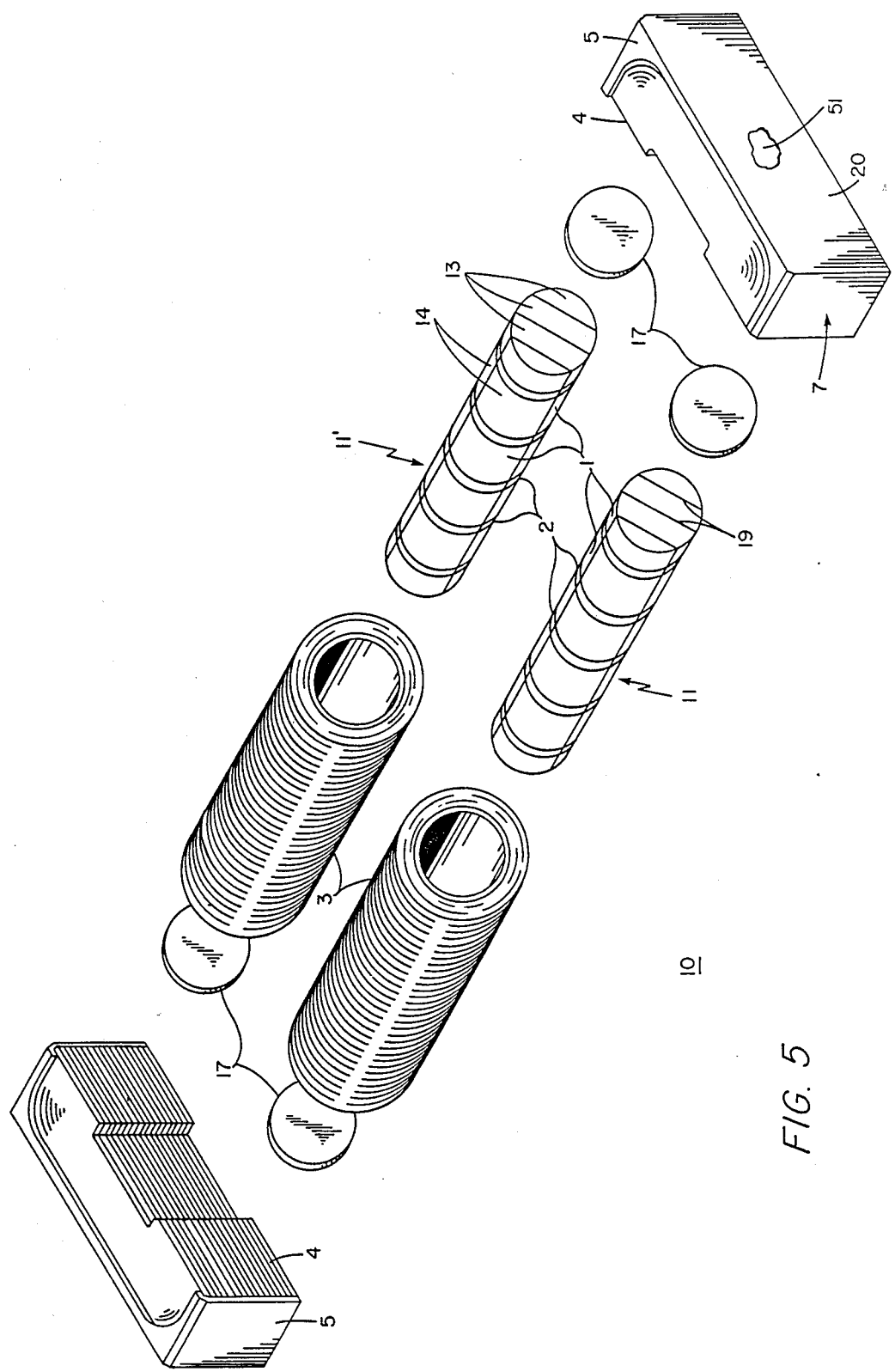
FIG. 5 is an exploded view of the drive module of FIG. 2.

The self-biased magnetostrictive stack 11 shown in isometric vie in FIG. 5 is fabricated by initially longitudinally cutting with a diamond saw substantially equal diameter cylindrical rods of Terfenol-D and unmagnetized samarium cobalt into slabs 13, 14, respectively of approximately one-quarter-inch thickness. Each slab has plane parallel faces produced by the cut. The Terfenol-D and samarium cobalt slabs 13, 14 are each reassembled to form slightly elliptical rods using an electrical insulative adhesive 19 such as commercially available General Electric Type 7031. The reassembled rods are then cut into disks 1 of Terfenol-D and disks 2 of samarium cobalt. Disks of Terfenol-D are interleaved with disks of samarium cobalt and are cemented together with structural epoxy 6, typically commercially available Type A-2/E, under 100-200 pounds of pressure which provides a one mil thick film of epoxy 6 bonding the disks 1, 2 to thereby form stack 11.

The maximum thickness of the slabs of Terfenol-D and samarium cobalt is determined by allowable eddy current losses. The characteristic frequency (the frequency at which the skin depth is twice the thickness of the slab) is given by the equation $(2\rho)/(\pi\mu(\text{thickness})^2)$ where $\rho$ = resistivity of Terfenol-D $\simeq 6.10^{-7}$ ohms-meters $\mu$ = permeability of Terfenol-D $\simeq 4\mu_o$ $\mu_o$ = permeability of air The resistivity and permeability of samarium cobalt are similar in magnitude to that of Terfenol-D. Since the permeability of lanthanide alloys and samarium cobalt is low and the resistivity high, the allowable thickness is relatively thick ($\simeq 0.25$ inches) relative to that of steel laminations ($\simeq 1$-2 mils) in the pole pieces 4, which have a much higher permeability. Reduction of eddy currents has the desirable effect of reducing the eddy current $I^2R$ losses and also reducing the opposing magnetomotive force of the non-uniform eddy currents which in turn causes a non-uniform flux density.

The number of slabs, their dimensions, and their placement are determined by an optimization procedure using a finite difference numerical computer program which solves Maxwell's equations and determines the magnetic field distribution throughout the magnetic circuit. The design of the self-biased drive module 10 is optimized with respect to leakage inductance, the amount of fringing flux, AC and DC magnetic field strengths, and field uniformities throughout the magnetic circuit. Since permeability and optimum DC bias points in lanthanide magnetostrictive materials are a function of applied stress the values for incremental permeabilities for the entire range of expected stress conditions in the transducer are utilized in the optimization process. The AC and DC fields in a self-biased lanthanide magnetostrictive stack 11 with distributed samarium cobalt magnets 2 can be made very uniform when combined with the high permeability return paths in the magnetic circuit of the pole pieces 4. Prior to being placed in the magnetic circuit, the magnetostrictive stacks 11 are placed in a strong magnetic field (approximately 150 kG) to fully magnetize the interleaved samarium cobalt disks 2. The self-biased stacks 11 are fitted with the high temperature magnet wire drive coils 3 prior to being joined with the pole pieces 4 by the above-mentioned structural epoxy 6 to form the module 10.

FIG. 5 is an exploded view showing the drive module 10 components for a typical drive module. A drive module 10 comprises a two-leg closed-path magnetic circuit. Magnetic flux generated by alternating current excitation of the solenoids 3 passes through the magnetic circuit comprising the solenoid enclosed Terfenol/samarium cobalt drive stacks 11, typically 3 to 6 inches long and 1 inch or more in diameter, through a glass fiber disks 17, typically 6 mil thick type G10 glass fiber reinforced resin, and high permeability pole pieces 4, typically 2 mil laminations of silicon iron. The disks 17 are optional, but if used, serve to insulate the stacks 11 from the head and tail masses 61, 62 which may be in contact with water when transducer 60 is in use. Each drive coil 3 consists typically of 700 to 1400 turns of number 18 gauge high temperature magnet wire. The drive coils 3 are wired so that the flux generated by each is in the series aiding direction around the magnetic circuit. The module design ensures near uniform AC and DC field distributions and minimizes demagnetization and leakage effects. The silicon iron pole piece laminations 4 are cemented to nonmagnetic end blocks 5 by a structural epoxy 6 (not shown in FIG. 5). The end blocks 5 have polished external surfaces 20 on their ends which enable them to be acoustically coupled to the head and tail masses 61, 62 of FIG. 1 by a grease joint of high temperature grease 51 between each of the end surfaces 50 and recesses 63, 64 of masses 61, 62, respectively.

Typical dimensions in a stack 11 for the Terfenol-D material 1 would be one-inch diameter disks, 0.55 inches in length for the four innermost disks and 0.275 inches in length for the two outermost disks of each stack 11 of FIGS. 3-5. The samarium cobalt permanent magnet disks 2 of FIG. 1 are typically 0.150 inches in length. Each slab is one-quarter-inch in thickness measured in the direction transverse to the long dimension of the stack 11. When terminated as in the module 10 in the silicon iron pole pieces 4, the AC and DC flux distribution throughout the stack 11 is sufficiently uniform and free of leakage flux that a high efficiency, high coupling factor module is obtained. With these typical dimensions, the variation in the longitudinal AC and DC fields is within several percent (5–10%) throughout the self-biased magnetostrictive stack 11 assembly.

In the construction of the self-biased drive module 10, the polarity of the self-biased magnetostrictive stacks 11 are such that the north pole of one stack and the south pole of the second stack are cemented to the same end block/pole piece assembly 7 in order to avoid bucking fields. The north and south field polarities are shown in FIG. 3. Similarly, the drive coils 3 are wired such that they both circulate the AC flux in the same direction through the magnetic circuit when energized either in parallel or in a series electrical connection. Thus, the polarizing DC flux travels upward in one stack 11 and downward in the remaining stack 11 of the module 10, and the AC flux follows the same path but reverses direction for each direction of reversal of the alternating current excitation of the coils 3. The modules 10, when tested as drive elements in transducers, resulted in overall efficiencies several times greater than those normally obtained in lanthanide-driven devices of the noninterleaved type of the prior art. In addition, the measured AC efficiencies compare very favorably with the best AC efficiencies (i.e. DC losses ignored) obtained in the most advanced prior art direct current-biased magnetostrictive transducers and in piezoelectric transducers. These desirable results provided by the inventive structure are a direct consequence of distributing the samarium cobalt disks throughout the Terfenol-D stack and using the low reluctance return paths of the pole pieces 4. This technique results in highly uniform AC and DC fields and full utilization of the Terfenol-D drive material. Flux is constrained to remain in the intended magnetic circuit and additional losses due to stray flux have been eliminated. The unshielded samarium cobalt magnets 2 have been subjected to high drive AC magnetic fields in modules 10 constructed in accordance with the invention for extended periods of time with no degradation in the DC magnetic field supplied by the magnets or in measured transducer performance. Since the samarium cobalt magnet disks 2 do not require shielding, the losses due to eddy currents generated in the prior art shield are eliminated in the embodiments of FIGS. 3–5. The self-biased drive module 10 completely eliminates the need for a direct current polarizing field and its associated losses as is common in the embodiments of the prior art. The direct current induced thermal burden that is normally placed on the direct current biased transducer of the prior art and the accompanying transmission cable losses are also eliminated.

The distributed permanent magnet assembly of module 10 its low reluctance return path virtually eliminates AC and DC stray flux external to the magnetic path of the module thereby resulting in a negligible magnetic signature and making the self-biased transducer containing such modules 10 virtually undetectable.

Figure 6:
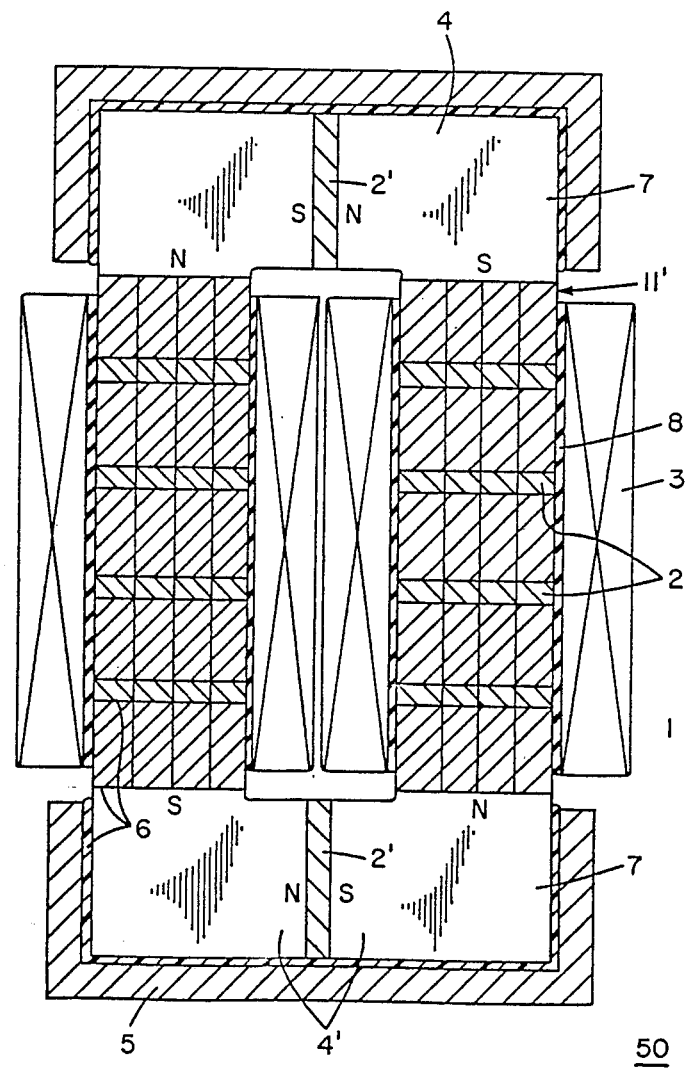
FIG. 6 is a cross-sectional view of another embodiment of the drive module of this invention.

FIG. 6 shows in cross-section a drive module 50 which is an alternate embodiment of the module 10 shown in FIGS. 2–5. The slight increase in length of the magnetostrictive drive stack 11 of module 10, because of the insertion of the permanent magnets 2, can be reduced somewhat as in module 50 by placing two of the biasing 2' in the pole piece/end block assembly 7 shown in FIG. 6. It is seen that the disks of Terfenol-D magnetostrictive material 1 are all of equal length and the number of permanent magnet disks 2 have been reduced by one in each stack 11', the total number of permanent magnet disks 2, 2' being the same as that in module 10. The magnetic polarity of the permanent magnets 2, 2' is series-aiding just as in the module 10. Module 50, although being slightly shorter in length than module 10 because of the placement of permanent magnets 2' between the two sections 4' of the pole piece 4, results in increased leakage flux between the two sections 4'.

Figure 7:
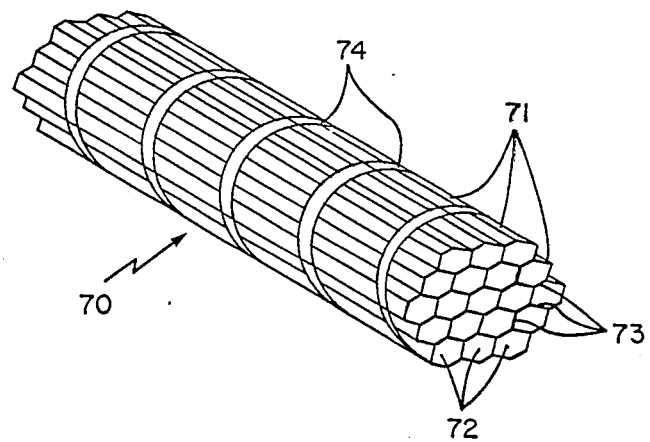
FIG. 7 is an isometric view of another embodiment of the drive stack of the drive module of FIGS. 2 and 6.

An alternative form of the drive stack 11 of FIG. 3 is shown as drive stack 70 of FIG. 7. The magnetostrictive drive elements 71 were fabricated from hexagonal rods of zone-melted grain-oriented Terfenol-D. The grain orientation in the material results in higher permeability, higher longitudinal coupling factor, higher compliance, and lower sound speed. The method used to obtain grain orientation is a free-standing zone-melting technique that limits the maximum diameter of the Terfenol-D rods to about 3/10 inch. Hence, a high packing factor and large cross-sectional area of material enclosed by a single coil is obtained by using many component rods 72 as shown in FIG. 7. In order to achieve a high packing factor, the 0.3 inch diameter grain oriented rods were machined into hexagonal cross-section (0.25 inch across that flats) and bonded together with electrical insulative adhesive 73. The use of electrical insulative adhesive is important in order to electrically isolate the rods from each other, thereby limiting the orbital diameters of eddy currents to approximately 0.25 inches. The bundle of adhered rods formed by the adhesive are cut into disks 71. The disks 71 are interspersed with the samarium cobalt disks 74, which were prepared as in the drive stack 11. Disks 71, 74 are bonded to each other to form an alternative form of magnetostrictive stack 70.

Fabrication of the stack from large diameter round rods producing drive stacks 11 as shown in FIGS. 3–5 are preferred over the hexagonal-bar form of stack 70 because they are cheaper, and because it is more difficult to fabricate a coil 3 with an internal diameter which minimizes the air space between the coil 3 and the stack 70 than it is when the stack is substantially round as is stack 11. A close fit is desired in order to reduce leakage inductance of the coil 3.

Tonpilz projectors or transducers of the type shown in FIG. 1, which incorporate the drive module 10 of this invention, resulted in improved performance characteristics over those which were previously obtainable. An in-water transducer coupling factor of 0.50, overall efficiencies in excess of 65 percent, and duty cycles approaching 50 percent at high drive levels have been achieved.

The magnetostrictive alloys of the lanthanide series, such as those used in the drive module 10, possess advantages over competing drive materials for low-frequency applications. The degree to which these advantages can be exploited is determined by the extent to which engineering problems arising from the intrinsically low permeability associated with the lanthanide materials can be overcome. The term "lanthanide" refers to the lanthanide series of elements (lanthanum, atomic number 57, is the first in the series), several of which (Sm, Tb, Dy, Ho, Er, and Tm) in the form of alloys display extraordinary magnetostriction. The term "rare earth" has been used to characterize these elements, but since they are neither rare nor are they earths (a term meaning "oxide"), the term "lanthanide" is to be preferred. The highly magnetostrictive nature of these lanthanide elements and the development of lanthanide alloys which produce large magnetostrictions at normal operating temperatures has resulted in at least one presently preferred lanthanide alloy, Terbium-Dysprosium-Iron alloy, i.e., $Tb_{0.3}Dy_{0.7}Fe_{1.9}$ (Terfenol-D).

Terfenol-D is capable of producing over 5 times the rms strain developed by the most competitive piezoceramics, and over 10 times the rms strain developed by the most competitive non-lanthanide (i.e. nickel) magnetostrictive alloys. Since the acoustic output power generated by an underwater projector or transducer is proportional to the square of the strain, lanthanide-driven transducers result in a large advantage in power producing capability. Additionally, Terfenol-D has a sound speed that is roughly 60 percent that of piezoceramic and possesses about 17 times the thermal conductivity. The low sound speed tends to improve bandwidth and lowers resonance frequency, while the high thermal conductivity tends to improve power handling capability and increases attainable duty cycle. The preceding description of the invention has described several embodiments of a novel transducer drive module and its incorporation into a transducer which has the following novel features. The module 10 incorporates samarium cobalt magnets which are stable even under conditions of extreme vibration and strong AC fields. Prior art magnets used in self-biasing configurations required sheet copper to shield the magnets from the AC field. Only samarium cobalt magnets (with the possible exception of other lanthanide-based magnets such as neodymium boron iron) possess the high intrinsic coercivity, residual induction, and stability to adequately bias lanthanide magnetostrictive projectors and do not require AC shielding.

The self-biased drive module 10 results in a very uniform bias and drive field because the disks 2 of samarium cobalt are distributed throughout the magnetostrictive stack. If, as in the prior art, the magnets were lumped, the fields would be nonuniform and efficiency and performance would be degraded.

The shell end block/pole piece assembly 7 design is exceedingly stiff and mechanically strong even though the pole pieces 4 are made of very fine laminations of steel. Being nonmagnetic, made of either aluminum or stainless steel, the end block 5 does not interfere with flux passing through the pole pieces 4. The end blocks 5 enable the ends 20 of drive module 10 to be ground flat and parallel to each other and to the same length as all other modules 10 in the same transducer much more easily than if the module were terminated solely with steel laminations 15. The end block 5 and 20 surfaces being ground smooth and flat can be inserted into slots 63, 64 of the transducer end masses 61, 62, respectively, which are also preferably ground flat and parallel. Grease 51 in the recesses 63, 64 between the drive module ends 5 and the transducer end masses 61, 62 acts to protect the module 10 from externally produced shock waves and allows the module 10 to be more easily replaced in the event of failure.

The modular construction of the drive assembly 10 facilitates easy installation and transducer manufacturability. Since it is anticipated that most lanthanide magnetostrictive transducers will incorporate a multitude of drive elements 10, the modular form of the transducer drive module 10 makes relatively simple the fabrication of the transducer and its servicing should a module need to be replaced.

The high temperature class silicon rubber 8, which fills the gap between the drive coil 3 and the magnetostrictive stack 11, miminizes mechanical friction losses, decouples the coil from the stack, and provides an improved heat path from the coil to the stack. Heat transfer between the coil 3 and the transducer end masses 61, 62 is further assisted by the orientation of the laminations 15 of the pole pieces as shown in FIG. 2. Heat flux flows through the pole piece laminations 15 without having to pass through the varnish insulation 16 between the laminations 15. The heat transfer capability is so good that a self-biased transducer similar to that shown in FIG. 6 may be driven at 200 oersteds indefinitely at a 40 percent duty cycle without overheating (temperature rise is approximately 170° F.).

Other advantages of the invention may be summarized as field uniformity for both AC and DC fields which is maintained in the low permeability lanthanide magnetostrictive drive elements even with low length-to-diameter ratios. Typically, the ratio of length-to-diameter of the drive stack 11 is approximately 3.5. The entire amount of Terfenol-D in the drive stack 11 is fully utilized. With the construction of the invention, demagnetization, fringing and stray flux are virtually eliminated. The transducer 60 has high conversion efficiency with peak overall efficiencies varying with specific transducer design and loading from 60 percent to 75 percent efficiency. The DC power requirements and their attendant losses for biasing the magnetostrictive material 1 has been eliminated. Blocking network electronics required to separate AC current from DC current has been eliminated by the self-biasing technique of the invention. The transducer's thermal burden has been greatly reduced by the elimination of the DC power required to bias the magnetostrictive material 1. Cable transmission losses when providing the DC current for biasing have been eliminated. The samarium cobalt permanent magnets need not be shielded from the AC field and are stable even when exposed to large AC fields. The improved thermal capability of the magnetostrictive drive 10 results in increased duty cycle capability for the transducer. There is low leakage inductance compared to prior art permanent magnet-biasing techniques, because substantially all of the flux is contained within the magnetic circuit. Because of the containment of the magnetic flux, the self-biased transducer made in accordance with this invention has a very low magnetic external field. Finally, the modular form of construction of the magnetostrictive drive 10 makes these drivers easy to install and remove for fabrication and repair.

There is only a slight sacrifice in AC efficiency which, however, results in a far greater increase in overall efficiency because of the elimination of DC biasing. Typically, self-biased lanthanide transducers have AC efficiencies that are a few percent lower than an optimized transducer with corresponding return path pole pieces. The slight reduction in AC efficiency is caused by some additional copper losses that arrise from the increased reluctance of the magnetic circuit caused by the inclusion of permanent magnets 2 and the small additional eddy current losses in the laminated magnets.

Typical dimensions of the permanent magnet and magnetostrictive disks 1, 2 in the stacks 11, 50 in the preferred embodiments have been given earlier and resulted in an AC and DC magnetic field distribution in the low-permeability Terfenol-D magneostrictive material which was uniform within 5–10 percent. Uniformity of magnetic field is desired to avoid degradation in performance which results from magnetic saturation in portions of the structure of the drive module. It is intended that this invention include dimensioning of the disks 1, 2 other than that illustrated in the preferred embodiment which likewise produce the desired degree of uniformity of magnetic field.

In addition to the tonpilz type transducer shown in FIG. 1, the drive modules of this invention can also be used with a cylindrical type transducer, well known to those skilled in the art, where the drive modules of this invention are between adjacent segments of the cylinder to which a force is applied by tensioned bolts or wires to compress the drive modules.

Having described a preferred embodiment of the invention, it will be apparent to one of skill in the art that other embodiments incorporating its concept may be used. It is believed, therefore, that this invention should not be restricted to the disclosed embodiment but rather should be limited only by the spirit and scope of the appended claims.

What is claimed is:

1. A magnetostrictive drive module comprising:
   a pair of drive stacks;
   each drive stack comprising a plurality of interleaved disks of permanent magnets and magnetostrictive material;
   each of said disks having longitudinal cuts with electrical insulation therein which electrically insulate portions of each of said disks formed by said cuts to form laminated disks;
   a pair of high magnetic permeability material pole pieces, each pole piece bridging the ends of said stacks to provide a magnetic circuit with said stacks;
   each said end pole piece comprising laminated sheets of said magnetic material; and
   a solenoid around each of said drive stacks.

2. The drive module of claim 1 comprising in addition:
   at least one end pole having said laminated sheets transversely separated into at least two groups;
   said groups separated by a permanent magnet having longitudinal cuts with electrical insulation therein to electrically isolate the portions of said permanent magnet magnet formed by said cuts.

3. The drive module of claim 1 comprising in addition:
   a nonmagnetic end block having a cavity;
   said pole piece laminations being contained within and adhered to the cavity of said end block to form an end pole assembly.

4. A magnetostrictive transducer comprising at least one magnetostrictive drive module comprising:
   a pair of drive stacks;
   each drive stack comprising a plurality of interleaved disks of permanent magnets and magnetostrictive material;
   each drive stack having longitudinal cuts which electrically insulate portions of said disks formed by said slots;
   a pair of high magnetic permeability material pole pieces, each pole piece bridging the ends of said stacks to provide a magnetic circuit with said stacks;
   each said end pole piece comprising laminated sheets of said magnetic material;
   a solenoid around each of said drive stacks;
   at least one end pole having said laminated sheets transversely separated into at least two groups;
   said groups separated by a permanent magnet having longitudinal cuts with electrical insulation therein to electrically isolate the portions of said permanent magnet magnet formed by said cuts;
   a head mass;
   a tail mass;
   said drive module having its end pole assemblies in contact with said head and tail masses; and
   means for providing a force on said head and tail masses to thereby compress said drive module.

5. The transducer of claim 4 wherein:
   said head and tail masses have slots sufficiently large to allow said end pole to b retained within said slots when in contact with said head and tail masses.

6. A magnetostrictive drive stack comprising:
   a plurality of first disks of permanent magnets;
   a plurality of second disks of magnetostrictive material;
   said disks of magnetic and magnetostrictive materials being interleaved to form a stack of contacting disks;
   said first and second disks being comprised of slabs which are electrically insulated from each other and forming at least first and second slabs.

7. The drive stack of claim 6 wherein:
   said permanent magnets have a high resonant flux density and high coercive-force; and
   said magnetostrictive material is a high-stain coefficient material of low permeability.

8. The drive stack of claim 7 wherein:
   said permanent magnets are samarium cobalt magnets; and
   said magnetostrictive material is a lanthanide alloy.

9. The drive stack of claim 8 wherein:
   said lanthanide alloy is $Tb_{0.3}DY_{0.7}Fe_{1.9}$.

10. A magnetostrictive drive stack comprising:
    a plurality of rods of magnetostrictive material in side-by-side contact with each other to form a bundle of rods;
    said rods in said bundle being electrically insulated from each other and adhesively connected to each other;
    a plurality of disks of said bundles;
    a plurality of disks of permanent magnets;
    each said magnet disk being comprised of slabs of partial disks electrically insulated from and adhesively attached to each other to form said disk;
    said disks of magnets and magnetostrictive material being interleaved to form a stack of disks; and
    means for compressing said stack of disks.

11. A magnetostrictive drive module comprising:
    an electrical coil;
    a stack of interleaved contacting disks of permanent magnet material and magnetostrictive material;
    said coil extending over the length of said stack;
    a magnetic circuit in contact with the ends of said stack to provide a magnetic return path for the flux of said stack.

12. The module of claim 1 wherein each of said disks is comprised of a plurality of electrically insulated portions to form laminated disks.

13. The module of claim 1 wherein said stack of disks contains at least one longitudinal cut extending through said stack from one end to the other, said cut being transverse to the opposed surfaces of said disks.

14. The module of claim 1 wherein:
said stack and disks are cylindrical and have an axis of symmetry;
each of said disks having flat opposed surfaces transverse to said axis and in contact with adjacent ones of said surfaces in said stack.

15. The magnetostrictive drive module of claim 1 wherein:
said disks are dimensioned to produce substantially uniform magnetic flux within said stack.

16. The magnetostrictive drive module of claim 1 wherein:
said disks of magnetostrictive material have a permeability less than ten.

17. A magnetostrictive drive module comprising:
a pair of drive stacks;
each drive stack comprising a plurality of interleaved contacting disks of low permeability permanent magnets and low permeability magnetostrictive material;
a pair of high magnetic permeability material pole pieces, each pole piece bridging the ends of said stacks to provide a magnetic circuit with said stacks, the magnetic field within said magnetic circuit produced by said permanent magnets being substantially uniform;
each said end pole piece comprising laminated sheets of said magnetic material; and
a first and second solenoid around each of said drive stacks, respectively.

18. The magnetostrictive drive module of claim 17 comprising in addition:
an elastomer between said solenoid and the drive stack holding said solenoid in fixed relationship with respect to said stack.

19. The magnetostrictive drive module of claim 17 wherein:
each said stack having a longitudinal axis;
each end of s id drive stacks is polished flat and transverse to the axis; and
said pole pieces also polished flat at the area of contact with said stacks.

20. The magnetostrictive drive module of claim 19 comprising in addition:
an end block in which said pole piece is adhered to one side of said block;
said end block having a flat surface on the opposite side of said end block, said surface being transverse to the axes of said stacks.

* * * * *